United States Patent
Bae et al.

(10) Patent No.: US 7,733,099 B2
(45) Date of Patent: Jun. 8, 2010

(54) MONITORING PATTERN FOR DETECTING A DEFECT IN A SEMICONDUCTOR DEVICE AND METHOD FOR DETECTING A DEFECT

(75) Inventors: Choel-Hwyi Bae, Suwon-si (KR);
Yong-Woon Han, Suwon-si (KR);
Mi-Joung Lee, Seongnam-si (KR);
Sang-Deok Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 427 days.

(21) Appl. No.: 11/798,838

(22) Filed: May 17, 2007

(65) Prior Publication Data
US 2007/0296447 A1 Dec. 27, 2007

(30) Foreign Application Priority Data
May 18, 2006 (KR) .................... 10-2006-0044834

(51) Int. Cl.
*G01R 31/305* (2006.01)
*G01R 31/26* (2006.01)

(52) U.S. Cl. ...................... 324/751; 324/765
(58) Field of Classification Search .............. None
See application file for complete search history.

(56) References Cited

U.S. PATENT DOCUMENTS

| 6,147,507 | A | * | 11/2000 | Shabde et al. ............... 324/766 |
| 6,566,885 | B1 | * | 5/2003 | Pinto et al. .................. 324/501 |
| 6,642,519 | B2 | * | 11/2003 | Ikeda .......................... 438/14 |
| 6,770,496 | B2 | | 8/2004 | Hamamura et al. |
| 6,828,815 | B2 | * | 12/2004 | Ishida et al. ................ 324/765 |
| 7,468,530 | B2 | * | 12/2008 | Lee et al. .................... 257/207 |
| 2003/0001598 | A1 | | 1/2003 | Weiner et al. |
| 2003/0071213 | A1 | * | 4/2003 | Ikeda ......................... 250/307 |
| 2003/0188273 | A1 | * | 10/2003 | Kundu et al. .................. 716/4 |
| 2005/0139767 | A1 | | 6/2005 | Pinto et al. |
| 2006/0030061 | A1 | * | 2/2006 | DiBiase ...................... 438/14 |
| 2008/0084223 | A1 | * | 4/2008 | Lee et al. .................... 324/751 |
| 2008/0250361 | A1 | * | 10/2008 | Bae et al. ...................... 716/2 |

FOREIGN PATENT DOCUMENTS

JP 2005-347773 12/2005

* cited by examiner

*Primary Examiner*—Jermele M Hollington
(74) *Attorney, Agent, or Firm*—Lee & Morse, P.C.

(57) ABSTRACT

A monitoring pattern for detecting a defect in a semiconductor device allows a voltage contrast inspection which may be verified by an electrical test where no special test pattern is required for the electrical test. The monitoring pattern includes a test pattern with line shapes arranged in parallel and spaced apart at predetermined linewidths and intervals, and an interconnection layer connected to the test pattern, where the test pattern is adapted to be charged with a specific potential to be displayed as a voltage contrast image when scanned with an electron beam.

12 Claims, 12 Drawing Sheets

MONITORING PATTERN FOR DETECTING A DEFECT IN A SEMICONDUCTOR DEVICE AND METHOD FOR DETECTING A DEFECT

BACKGROUND OF THE INVENTION

1. Field of the Invention

The present invention relates to monitoring patterns for detecting a defect in a semiconductor circuit and methods for detecting the defect. More particularly, the present invention relates to monitoring patterns for detecting a defect by electron beam scanning and method for detecting the defect.

2. Description of the Related Art

Voltage contrast inspection has been used to monitor semiconductor circuits and processes. The voltage contrast inspection may utilize the intensity of secondary electrons, released when a test pattern is exposed to electron beam, which may be represented as a voltage contrast image.

In a test pattern, a low potential state portion may be a high intensity portion of secondary electrons, while a high potential state portion may be a low intensity portion thereof. The low potential state portion may thus be brightly displayed, while the high potential state portion may be darkly displayed.

During a typical voltage contrast inspection, the low potential state portion may be designated as a grounded pattern, and the high potential state portion may be designated as a floating pattern. When defects are generated in the test pattern to cut off the grounded pattern or to connect the grounded pattern to the floating pattern, a portion cut off from the grounded pattern may be displayed as the high potential state portion, and the floating pattern short-circuited from an adjacent grounded pattern may be displayed as the low potential state portion. Accordingly, when the portion displayed on a voltage contrast image is different from the portion displayed by scanning the test pattern with an electron beam, it may be employed as a detection method to judge the type and location of the defect.

FIG. 1 illustrates an intensity graph of a test pattern for detecting a defect and a voltage contrast image. The test pattern may be made of a conductor in which grounded patterns 10 and floating patterns 12 are alternately formed. During a voltage contrast inspection, the grounded patterns 10 may be displayed as a bright image and the floating patterns 12 may be displayed as a dark image. The test pattern may be scanned using an electron microscope in an X-direction, and secondary electrons may be detected by a secondary electron detector to obtain the voltage contrast image including the bright grounded pattern 10 and the dark floating pattern 12.

The intensity of secondary electrons may be represented as a graph 14 by scanning the test pattern in the X-direction. When a defect, e.g., a short-circuit or an open-circuit, occurs in the test pattern, higher values and lower values may be alternately displayed on the graph 14.

As illustrated in FIG. 2, when a short-circuit Ax or an open-circuit Ay occurs in a circuit being tested, an intensity value displayed on the graph 14 may be different from an expectation value. For example, when a voltage contrast inspection value is obtained while scanning the test pattern in the X-direction, an intensity value at a position where the short-circuit Ax occurs in the grounded pattern 10a may be smaller than an expectation value Ex. Similarly, an intensity value of a position where the open-circuit Ay occurs in a floating pattern 12a may be larger than an expectation value Ey. The position of the defect may be detected by the scanning the test pattern with the X-direction scan and an Y-direction scan.

The voltage contrast inspection may thus be conducted to detect the position of the defect occurring in the test pattern, as well as the type of the defect. The voltage contrast inspection may therefore be advantageous to monitor a pattern and a process on a substrate inside a production line. Nonetheless, the voltage contrast inspection may be incapable of judging whether the defect detected by the voltage contrast inspection is an electrical defect causing a malfunction of a semiconductor device.

The above information disclosed in this Background section is only for enhancement of understanding of the background of the invention, and therefore it may contain information that does not form the prior art that is already known in this country to a person of ordinary skill in the art.

SUMMARY OF THE INVENTION

The present invention is therefore directed to a monitoring pattern for detecting a defect in a semiconductor circuit, which substantially overcomes one or more of the problems due to the limitations and disadvantages of the related art.

It is therefore a feature of an embodiment of the present invention to provide a monitoring pattern, which detects a defect in a test pattern.

It is therefore another feature of an embodiment of the present invention to provide a method for detecting a defect in a semiconductor device that may include an electrical test and/or a voltage contrast inspection.

At least one of the above and other features and advantages of the present invention may be realized by providing a monitoring pattern which may include a test pattern with multiple line shapes arranged in parallel and spaced apart at predetermined linewidths and intervals, and an interconnection layer which may be connected to the test pattern, where the test pattern may be adapted to be charged with a specific potential to be displayed as a voltage contrast image when scanned with an electron beam.

The test pattern may include grounded patterns extending in parallel at predetermined intervals. Each of the grounded patterns may have a shape of a U, and the test pattern may include a first sub-set where both branches of the U extend in a first direction and a second sub-set where both branches of the U extend in a second direction. The grounded patterns of the first sub-set and the grounded patterns of the second sub-set may alternate. At least one of the branches of the grounded patterns of the first sub-set may extend between branches of the grounded patterns of the second sub-set. Each of the grounded patterns may include a first segment set composed of first conductors, a second segment set composed of second conductors on the first segment set, and contact patterns formed to connect the first segment set with the second segment set. The test pattern may include a first pattern set formed from grounded patterns and a second pattern set formed from floating patterns, and the grounded patterns and the floating patterns may be alternately arranged and adapted to be charged with a specific potential when scanned with the electron beam.

The interconnection layer may include at least one first interconnection connected to the grounded patterns and at least one second interconnection connected to the floating patterns, the first and second interconnections being adapted to measure electrical continuity between the grounded patterns and the floating patterns. The monitoring pattern may also include at least one sub-pattern set between adjacent grounded and floating patterns, and the sub-pattern set may include a first sub-patterns extending in parallel from the grounded pattern and second sub-patterns extending in parallel from the floating pattern. The test pattern may include sub-pattern sets each composed of the first sub-pattern and the second sub-pattern which are arranged at a specific linewidth and a specific pitch. At least one sub-pattern may be between adjacent grounded and floating patterns, and the sub-pattern may include of parallel feature portions to connect the grounded pattern with the floating pattern. The test pattern may include the sub-patterns, each having a feature portion at a specific linewidth and a specific pitch. The sub-pattern may not be between at least one pair of adjacent grounded and floating patterns. The interconnection layer may include at least one probe pad adapted to measure electrical continuity of the grounded patterns, the probe pad being arranged to connect the grounded patterns.

At least one of the above and other features and advantages of the present invention may be realized by providing a method for detecting a defect in a semiconductor device, which may include forming a test pattern on a semiconductor substrate, the test pattern having line shapes arranged in parallel at predetermined linewidths and predetermined intervals, scanning an electron beam over the test pattern to perform a voltage contrast inspection, connecting interconnections to the test pattern, and measuring electrical continuity of the test pattern through the interconnections to verify the voltage contrast inspection.

When a voltage contrast value is different from an expected value while the electron beam is scanned over the test pattern, a defect may be detected. Forming the test pattern may include forming a first pattern set including grounded patterns, and forming a second pattern set including floating patterns, where the grounded patterns and the floating patterns may be alternately arranged. At least one sub-pattern set may be formed between adjacent grounded and floating patterns, and the sub-pattern set may include first sub-patterns extending in parallel from the grounded pattern and second sub-patterns extending in parallel from the floating pattern arranged alternately with the first sub-patterns. The sub-pattern sets may be formed at the test pattern, where a first pattern and a second pattern of the respective sub-pattern sets may be formed at a specific linewidth and a specific pitch, and a defect caused by the linewidth and the pitch may be detected. When forming the test pattern, the test pattern may include grounded patterns extending in parallel at predetermined intervals, and when connecting the interconnections, at least one interconnection may connect the grounded patterns with each other.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
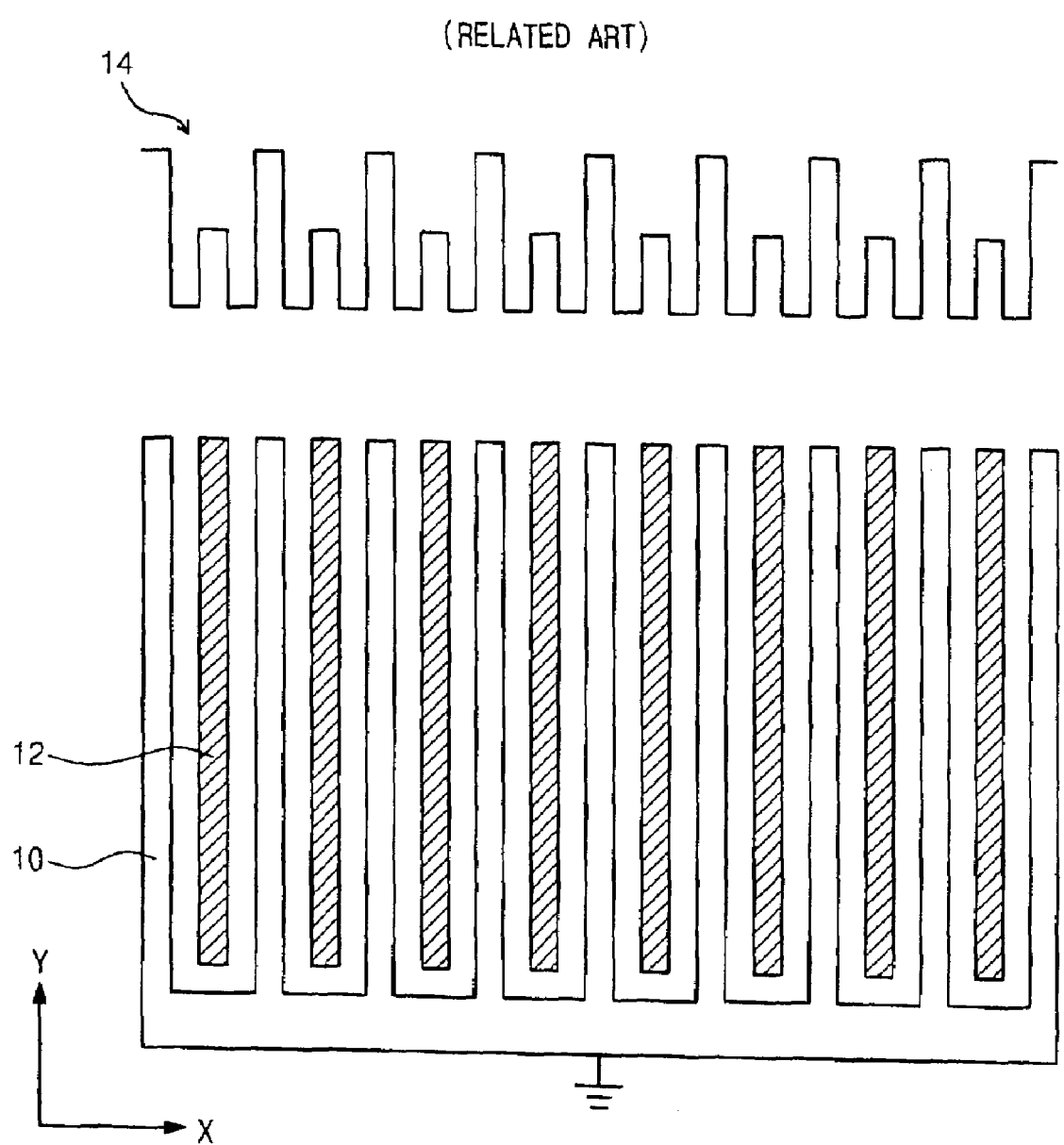
FIG. 1 illustrates a related art test pattern for a semiconductor device.
Figure 2:
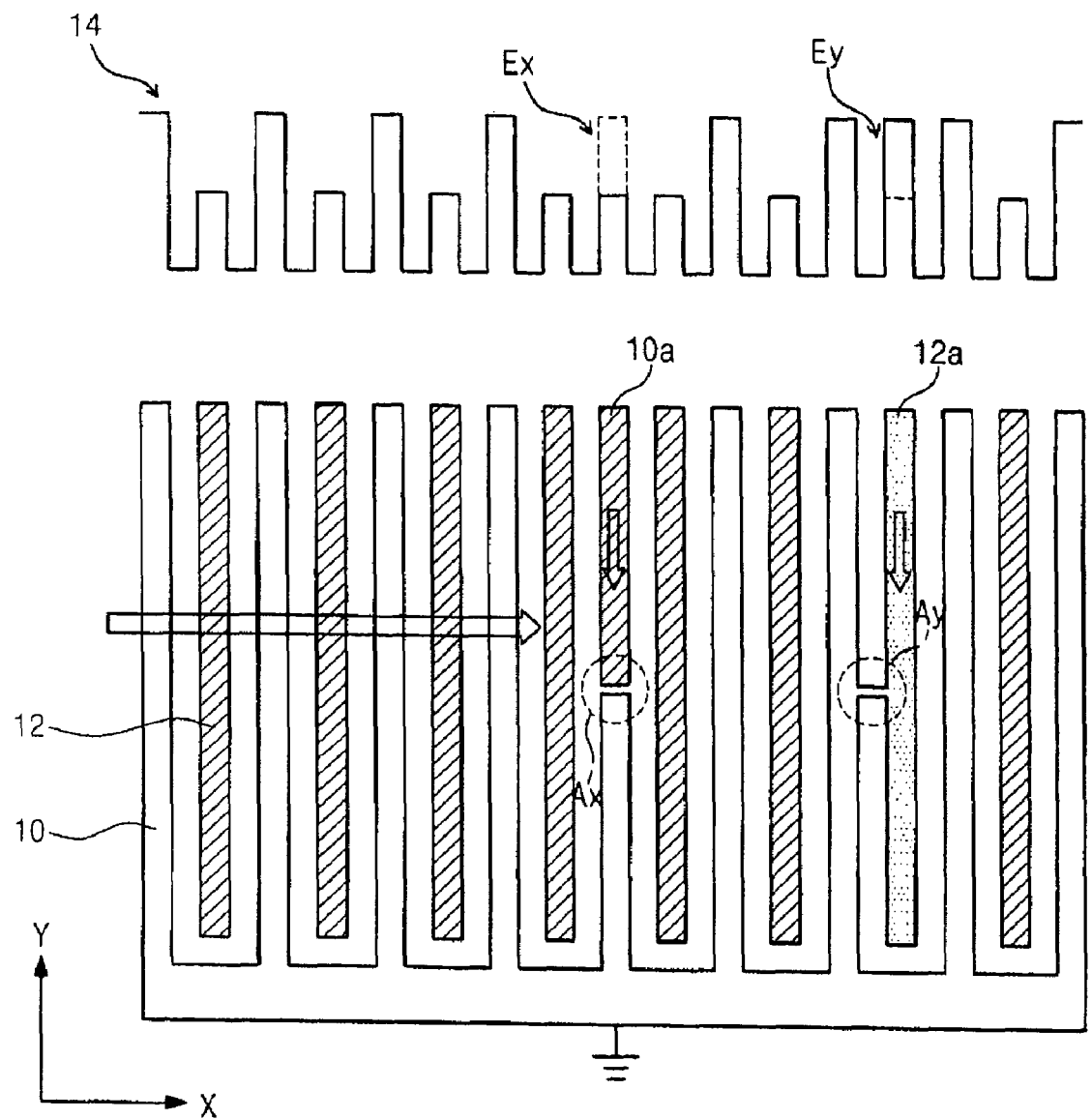
FIG. 2 illustrates a test pattern for a semiconductor device having a defect therein.

Korean Patent Application 2006-44834 filed on May 18, 2006, in the Korean Intellectual Property Office, and entitled: "Monitoring Pattern for Detecting Defect in Semiconductor Device and Method for Detecting Defect," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

A defect detected by a voltage contrast inspection may be verified by an electrical test to detect the reliability of the voltage contrast inspection. Since a special test pattern is not required for the electrical test, the present invention may be advantageous in establishing a layout and utilizing wafer space. Since the electrical test is conducted to determine whether the defect detected by the voltage contrast inspection has an effect on the operation of a circuit, the reliability and productivity of semiconductor devices may be enhanced. Further, when the results of the voltage contrast inspection and the electrical test match each other, the presence of a defect may be detected by the electrical test alone, i.e., omitting the voltage contrast inspection. Thus, a voltage contrast inspection apparatus may not be needed in a production line, and the time required for the voltage contrast inspection may be reduced.

Figure 3:
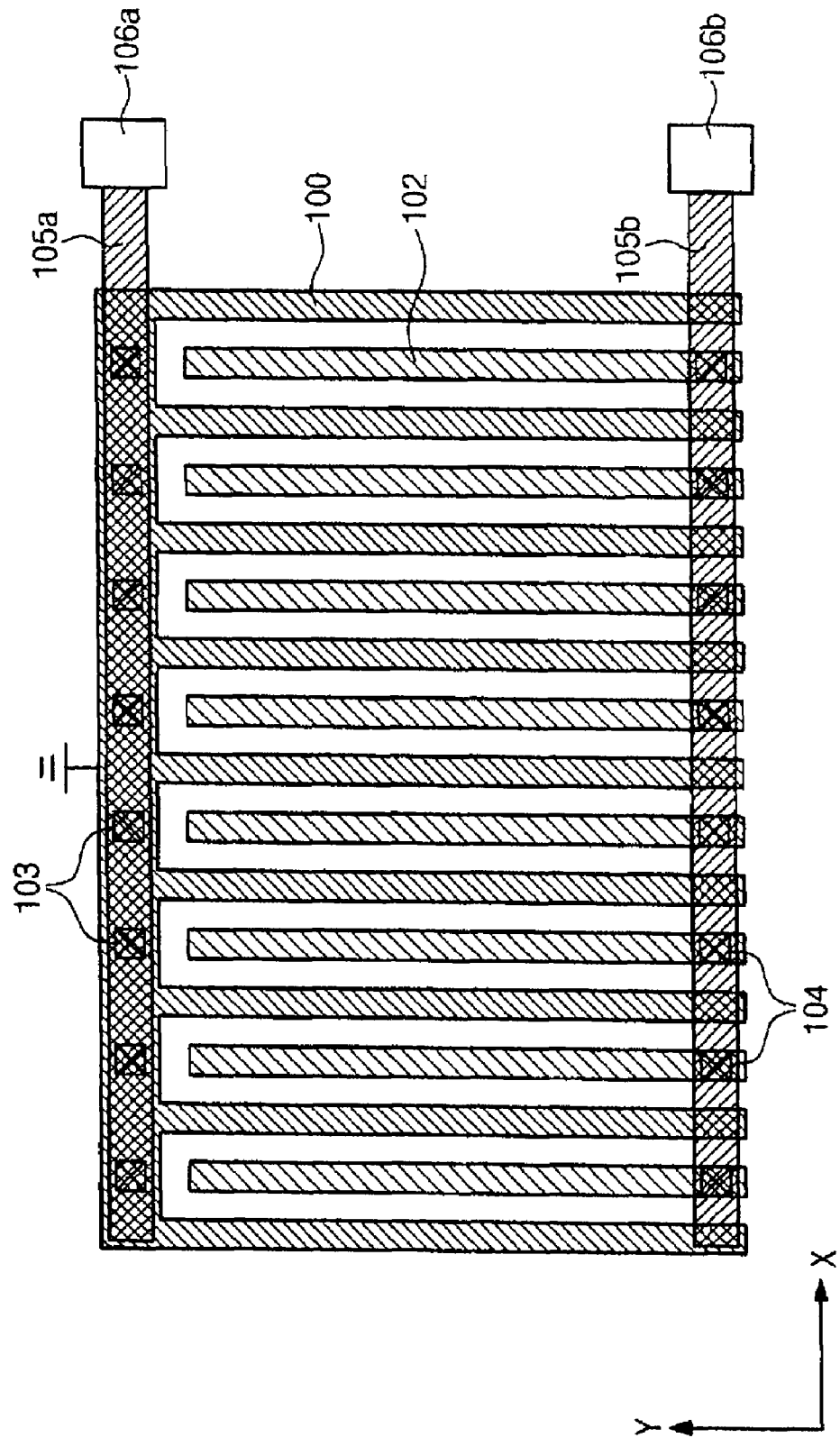
FIGS. 3 through 9 illustrate monitoring patterns for semiconductor devices according to embodiments of the present invention.

FIG. 3 illustrates a monitoring pattern according to a first embodiment of the present invention. The monitoring pattern may include a test pattern for a voltage contrast inspection. The test pattern may include a first pattern set including a grounded pattern 100 and a second pattern set including a floating pattern 102. The monitoring pattern may be designed so that line feature portions of the grounded pattern 100 and line feature portions of the floating pattern 102 are alternately arranged. The line feature portions of the grounded pattern 100 may be connected independently to a ground potential or connected in parallel thereto. On the other hand, the line feature portions of the grounded pattern 100 may be isolated from each other.

The monitoring pattern may be designed to employ the same layout as an existing test pattern for the voltage contrast inspection. Accordingly, during the voltage contrast inspection, defects in the test pattern may be detected by analyzing an intensity graph of secondary electrons released when the test pattern is scanned using an electron beam or a voltage contrast image. The defects may be classified into short-circuit defects and open-circuit defects. In the test pattern, the short-circuit defects may be detected by short-circuits of the grounded pattern 100, and open-circuit defects may be detected by an open-circuit of one of the line feature portions of the grounded pattern 100 and an adjacent line feature portion of the floating pattern 102.

When one of the line feature portions of the grounded pattern 100 is cut, a pattern isolated from the grounded pattern 100 may become a floating potential. Thus, a voltage contrast image and an intensity value of secondary electrons may be detected which are different from those expected at this point. The voltage contrast inspection may be conducted to discriminate between a short-circuit defect or an open-circuit defect, depending on whether a defective portion is a grounded pattern or a floating pattern. In the 2-dimensional coordinates (X, Y) of a defect, an X-coordinate may be detected by scanning the test pattern in an X-direction and an Y-coordinate may be detected by scanning the test pattern in an Y-direction from the X-direction. The Y-coordinate may be detected because the intensity of secondary electrons may be rapidly altered when the electron beam is scanned.

The voltage contrast inspection may be advantageous to detect the defect of the voltage contrast image. Nonetheless, it may be unclear whether the detected defect is an electrical defect. A monitoring pattern according to the present invention has a design that may electrically verify the result of a voltage contrast inspection. The monitoring pattern may be designed to measure an electrical continuity of the test pattern, which may make it possible to verify the result of the voltage contrast inspection by an electrical test.

A short-circuit defect of the test pattern may be verified electrically. When one of the line features of the floating pattern 102 is short-circuited with an adjacent line feature of the grounded pattern 100, the short-circuited floating pattern and the grounded pattern may be electrically connected to each other. Thus, the short-circuit defect of the grounded pattern 100 and the floating pattern 102 may be detected by measuring the electrical continuity between the floating pattern 102 and the grounded pattern 100.

To measure the electrical continuity, the monitoring pattern may include a first interconnection 105a connected to the grounded pattern 100 through a first contact pattern 103, and a second interconnection 105b may be connected to the floating pattern 102 through a second contact pattern 104. A first probe pad 106a and a second probe pad 106b may be formed at the first interconnection 105a and the second interconnection 105b, respectively. The first and second interconnections 105a and 105b may be designed to not be connected to each other. The measurement of the electrical continuity may be performed by inspecting current flowing between the first and second probe pads 106a and 106b.

If the result of the voltage contrast inspection is equivalent to the result obtained by measuring the electrical continuity, it may be possible to verify that the short-circuit defect detected during the voltage contrast inspection acts as an electrical short-circuit. Therefore, the voltage contrast inspection may be used to determine an accurate position of the defect and to analyze the cause of the defect. However, the existence or non-existence of a defect may not be judged only by measuring the electrical continuity. The electrical test may be conducted to determine if the defect exists, after a fabrication process is ended, without performing the voltage contrast inspection during the fabrication process.

Figure 4:
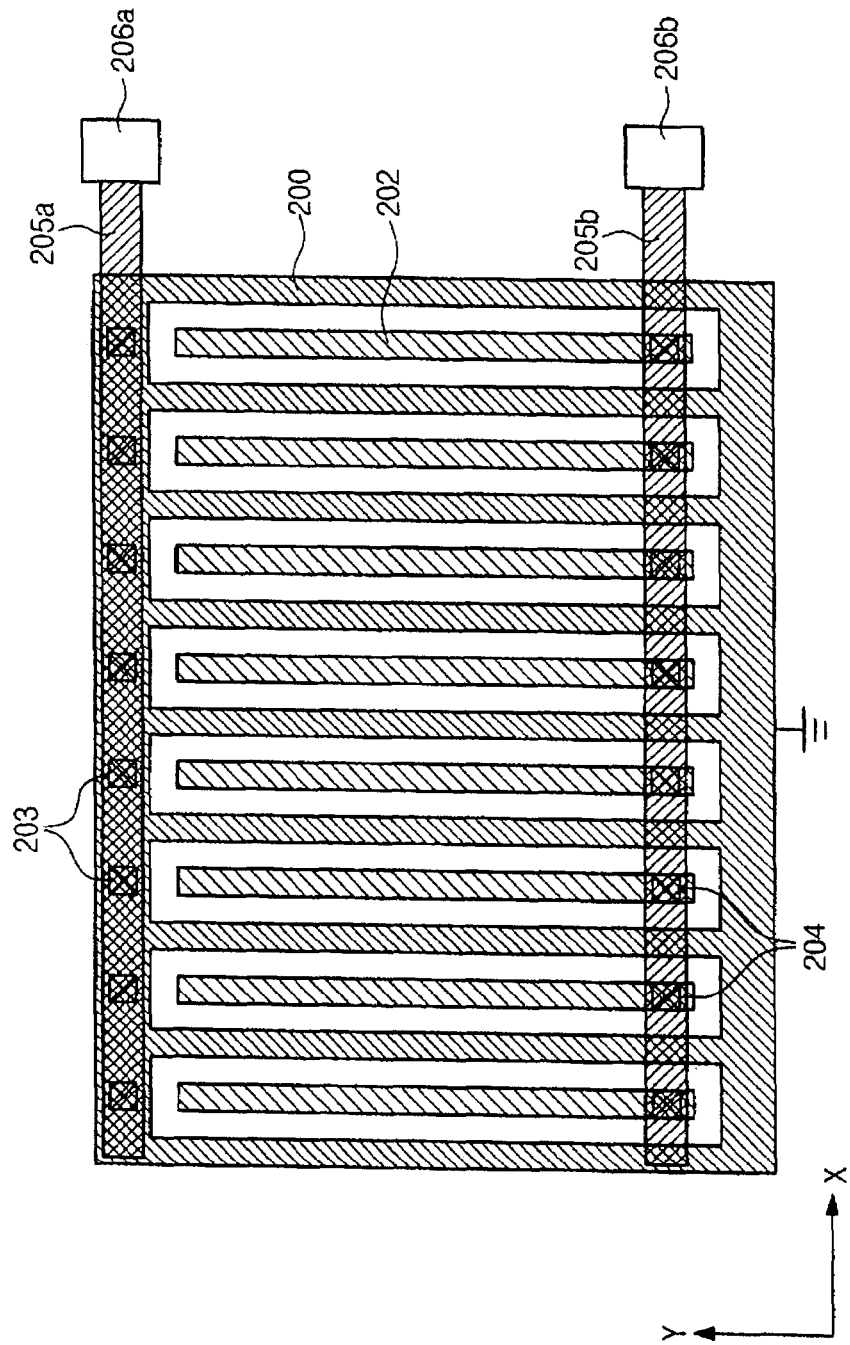

FIG. 4 illustrates a monitoring pattern according to a second embodiment of the present invention. In the monitoring pattern, a test pattern for a voltage contrast inspection may include a first pattern set including a line feature portion of a grounded pattern 200 and a second pattern set including a floating pattern 202. The grounded pattern 200 may be designed with a ladder shape to be connected to a ground potential. The floating pattern 202 may be a line-shaped pattern, which may be located between line feature portions of the grounded pattern 200. As a result, the grounded pattern 200 and the floating pattern 202 may have alternately arranged line feature portions.

The monitoring pattern further may include an interconnection layer for verifying an electrical continuity of the test pattern. A first interconnection 205a and a second interconnection 205b may be connected to the grounded pattern 200 and the floating pattern 202, respectively. The first interconnection 205a and the second interconnection 205b may be formed at a first probe pad 206a and a second probe pad 206b, respectively. The first interconnection 205a may be connected to the grounded pattern 200 through a first contact pattern 203, and the second interconnection 205b may be connected to the floating pattern 202 through a second contact pattern 204.

In the first and second embodiments of the present invention, the short-circuit and the open-circuit may be detected by the voltage contrast inspection, and the short-circuit of the test pattern may be detected by the electrical test.

Figure 5:
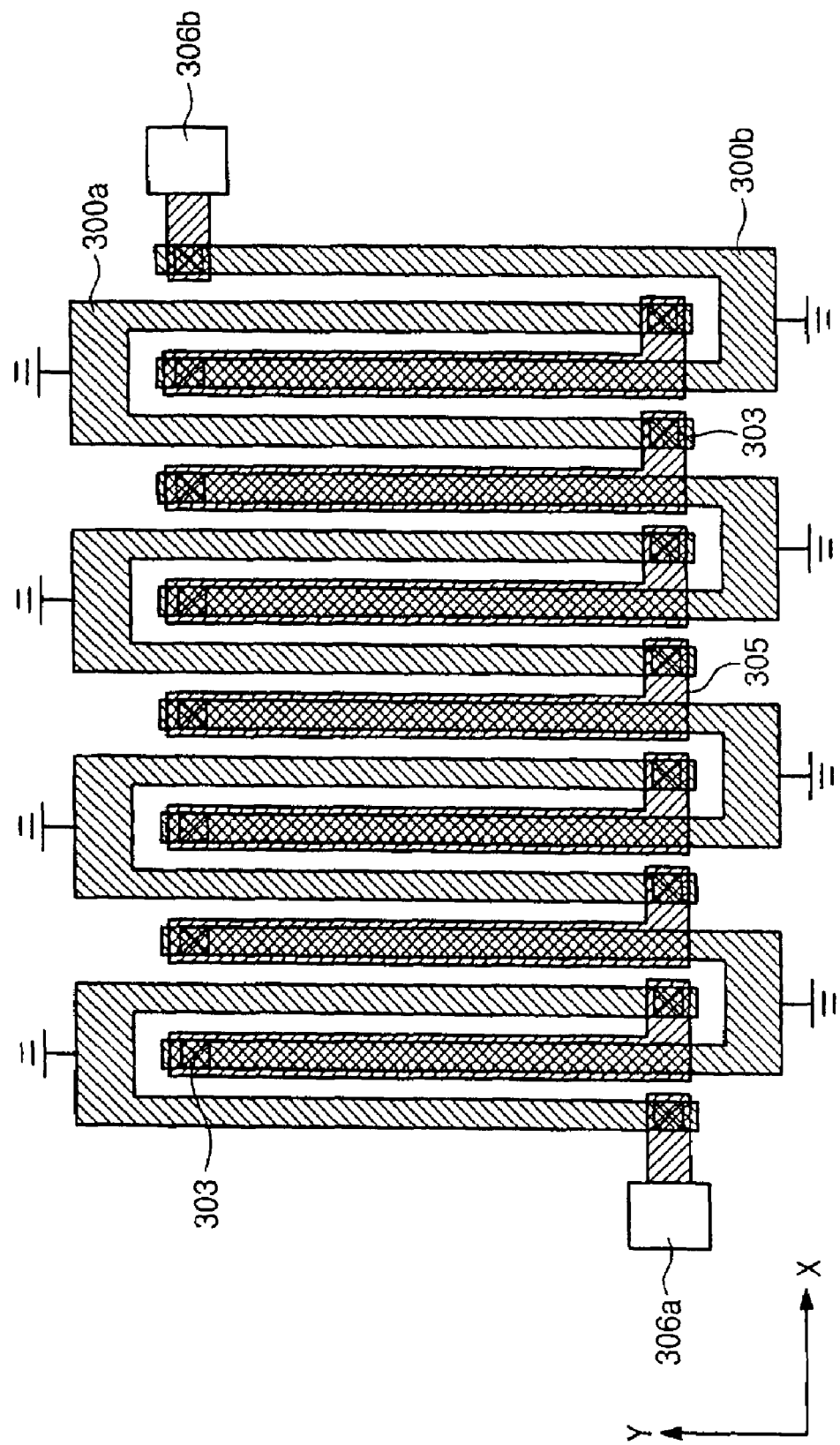

FIG. 5 illustrates a monitoring pattern according to a third embodiment of the present invention. The monitoring pattern may include a test pattern for a voltage contrast inspection. The test pattern may be designed with a pattern set including multiple grounded patterns 300a and 300b.

Each of the grounded patterns 300a and 300b may take the shape of an "U" where both branches extend in one direction. The first grounded patterns 300a, where the branches extend in a first direction, may constitute a first sub-set. The second grounded patterns 300b, where the branches extend in a second direction, may constitute a second sub-set. One of the branches of the second grounded patterns 300b may extend between the branches of the first grounded patterns 300a. One of the branches of the first grounded patterns 300a may extend between the branches of the second grounded patterns 300b. In a line feature portion of the test pattern, the first and second grounded patterns 300a and 300b may be designed to be alternately arranged.

Similar the first and second embodiments of the present invention, the test pattern may include grounded patterns and floating patterns which are alternately arranged. Thus, the voltage contrast image may display the ground potential and the floating potential. Meanwhile, in the third embodiment of the present invention, the voltage contrast image may display the ground potential of the grounded patterns, and the secondary electron intensity graph may display the voltage contrast of a region between grounded patterns and a tertiary electron intensity.

A portion of the test pattern isolated from the ground potential due to the short-circuit of the grounded patterns 300a and 300b may become a floating potential. Therefore, the voltage contrast image and a secondary electron intensity value may be displayed to be different from those expected. As a result, a defect may be detected.

The monitoring pattern may include an interconnection layer for measuring a electrical continuity of the test pattern. The interconnection layer may include an interconnection 305 formed to serially connect each first grounded pattern 300a with the corresponding second grounded pattern 300b. The interconnection 305 may be connected to the first and second grounded patterns 300a and 300b through a contact pattern 303. The contact pattern 303 may be connected to the ends of the grounded patterns 300a and 300b to measure the electrical continuity of a greater part of the test pattern. A first probe pad 306a and a second probe pad 306b may be formed at both ends of the interconnection 305, respectively. The first probe pad 306a may be connected to the first grounded pattern 300a, and the second probe pad 306b may be connected to the second grounded pattern 300b.

Figure 6:
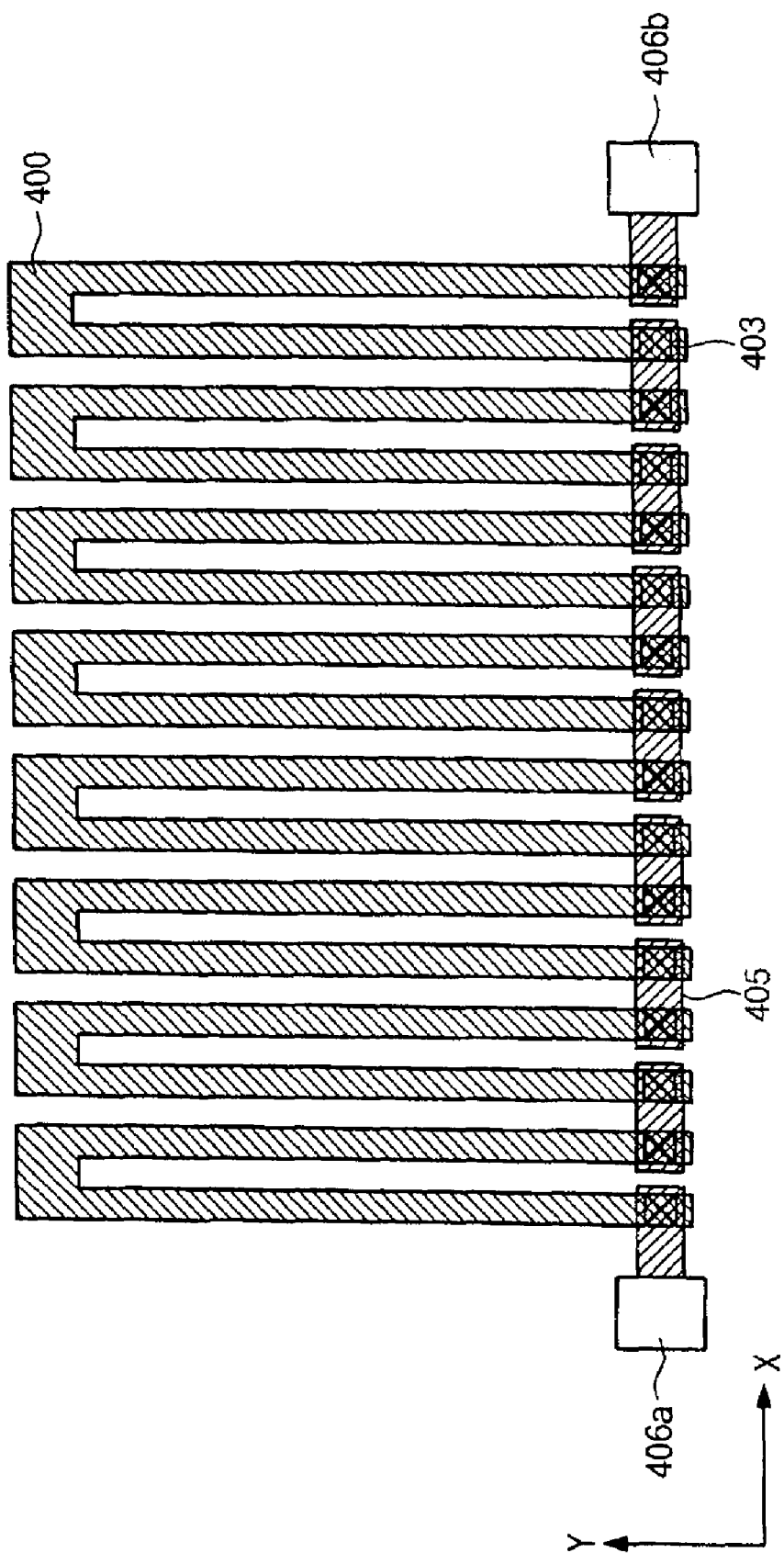

FIG. 6 illustrates a monitoring pattern according to a fourth embodiment of the present invention. The monitoring pattern may include a test pattern for a voltage contrast inspection. The test pattern may include a pattern set including multiple grounded patterns 400. The grounded patterns 400 may each take the shape of an "U" where both branches extend in one direction. The pattern set may include the grounded patterns 400 where branches extend in a first direction.

In the third and fourth embodiments of the present invention, the test pattern may include grounded patterns. The voltage contrast image and the secondary electron intensity graph may display potentials of grounded patterns and regions between the grounded patterns. Thus, a short-circuit defect of the grounded patterns 400 may be detected by scanning a line feature portion of the test pattern employing an electron beam.

The monitoring pattern may include an interconnection layer formed to serially connect the grounded patterns with each other. The interconnection layer may include an interconnection 405 formed to connect adjacent grounded patterns with each other, a contact pattern 403 formed to connect the interconnection 405 with the grounded patterns 400, and first and second probe pads 406a and 406b formed at both ends of the interconnection layer, respectively. The result of the voltage contrast inspection may be verified by measuring an electrical continuity between the first and second probe pads 406a and 406b.

Figure 7:
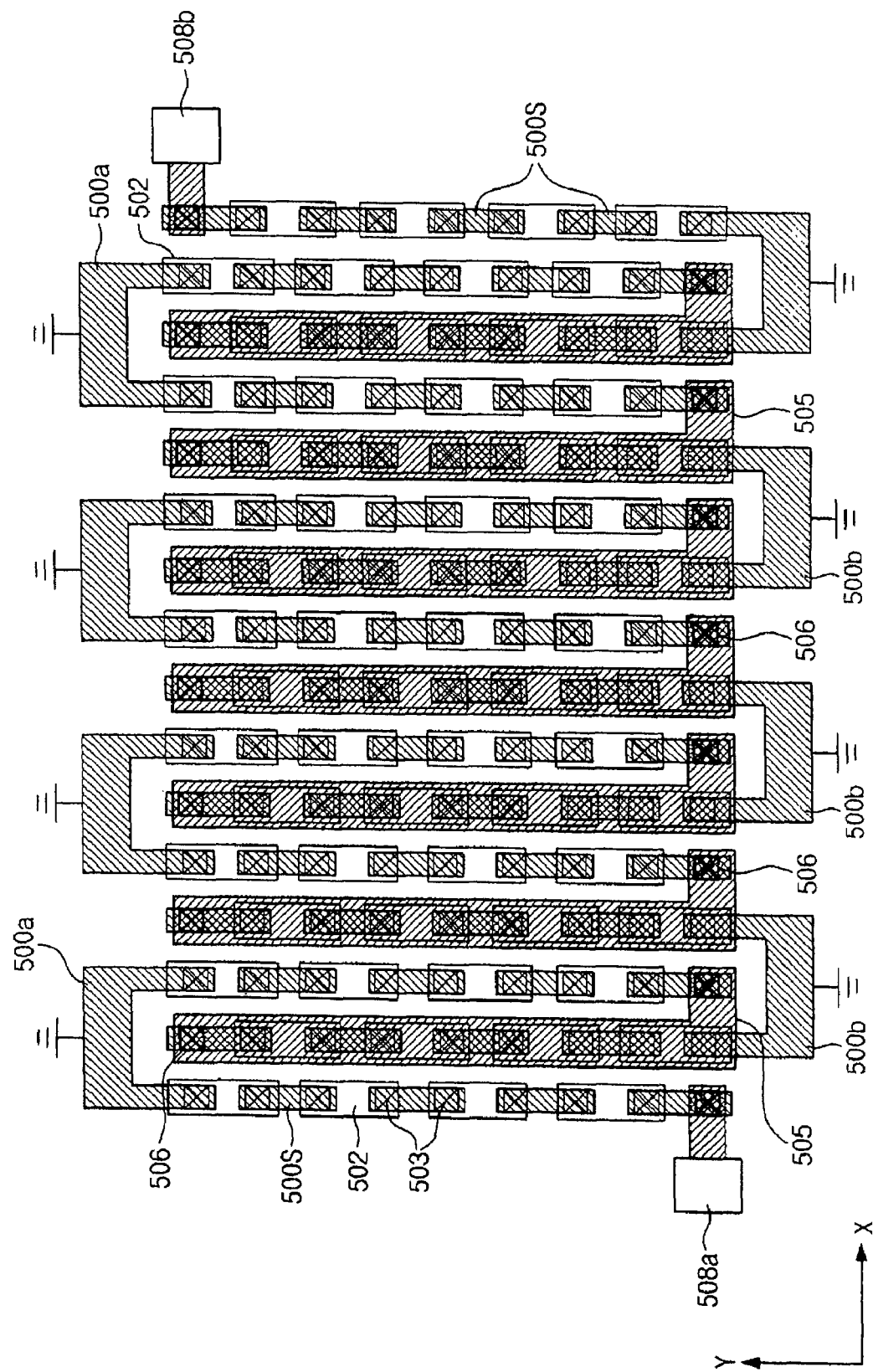

FIG. 7 illustrates a monitoring pattern according to a fifth embodiment of the present invention. The monitoring pattern may include a contact chain type test pattern. The monitoring pattern may be designed with a pattern set including multiple grounded patterns 500a and 500b.

The grounded patterns 500a and 500b may take the shape of an "U" where both branches extend in one direction. Each branch of the grounded patterns 500a and 500b may include a contact chain. The grounded patterns 500a and 500b may include multiple first segment sets 500S, multiple second segment sets 502 disposed over the first segment sets 500S, and first contact patterns 503 formed to serially connect the first segment sets 500S with the second segment sets 502 such that they alternate.

First grounded patterns of the grounded patterns 500a and 500b with branches extending in a first direction may constitute a first sub-set, and second grounded patterns of the grounded patterns 500a and 500b with branches extending in a second direction may constitute a second sub-set. One of the branches of the second grounded patterns 500b may extend between the branches of the first grounded patterns 500a, and one of the branches of the first grounded patterns 500a may extend between the branches of the second grounded patterns 500b. In a line feature portion of the test pattern, the first grounded patterns 500a and the second grounded patterns 500b may be alternately arranged.

An open-circuit defect of the grounded patterns 500a and 500b may be detected by a voltage contrast inspection. In this case, the open-circuit of the grounded patterns 500a and 500b may result from the open-circuit of the segment sets 500S and 502, and poor contact of the first contact patterns 503.

The monitoring pattern may include an interconnection layer for measuring a electrical continuity of the test pattern. The interconnection layer may include interconnections 505 formed to serially connect the first grounded patterns 500a with the second grounded patterns 500b so that they alternate. Second contact patterns 506 may be coupled to ends of the grounded patterns 500a and 500b to measure the electrical continuity. A first probe pad 508a and a second probe pad 508b may be located at both ends of the interconnections 505, respectively. The first probe pad 508a may be connected to the first grounded pattern 500a, and the second probe pad 508b may be connected to the second grounded pattern 500b.

The electrical continuity of the test pattern may be measured using the interconnection layer. Although the contact of the second contact pattern 506 may have an effect on the electrical continuity, reliable results may be secured because the second contact pattern 506 may be formed during a step having a high process margin.

Figure 8:
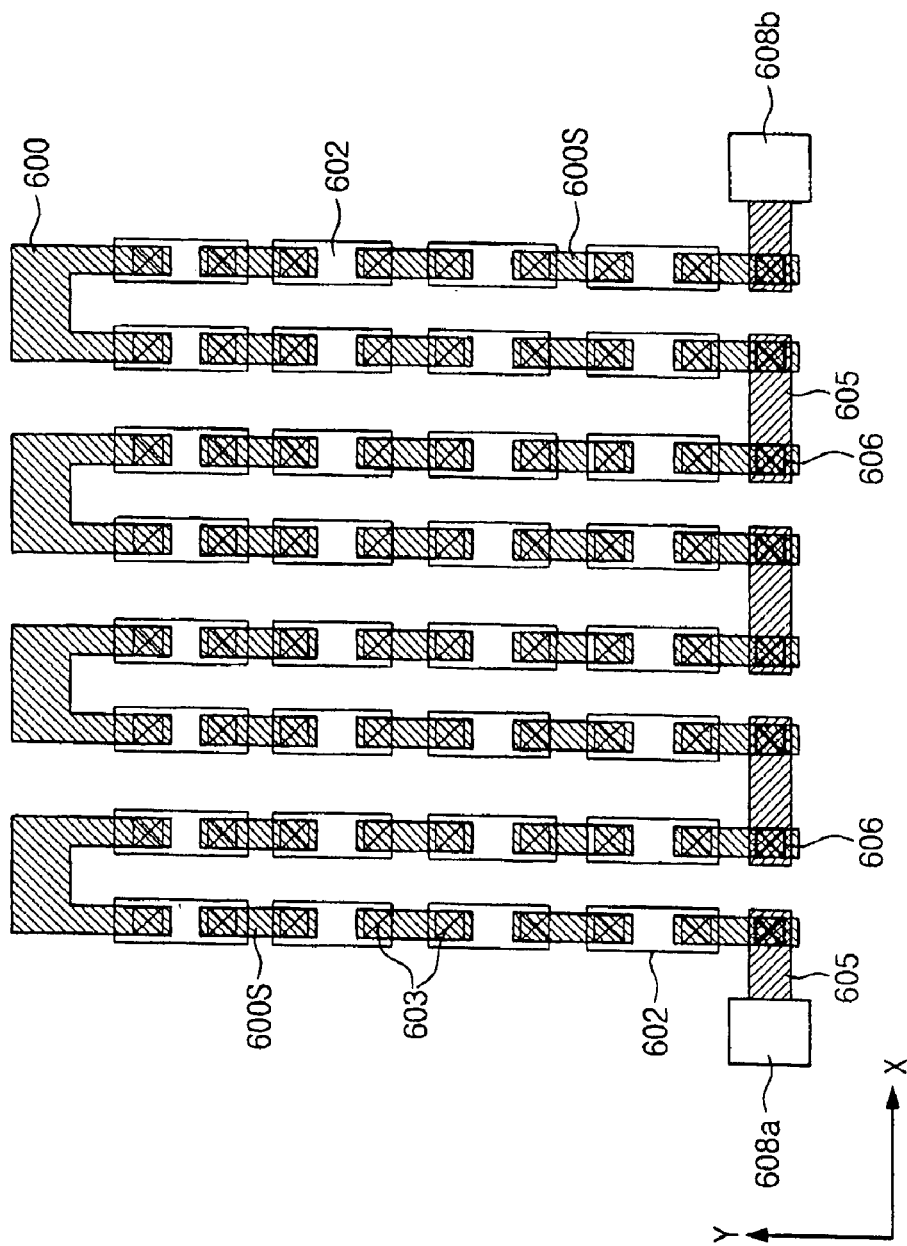

FIG. 8 illustrates a monitoring pattern according to a sixth embodiment of the present invention. The monitoring pattern may include a test pattern for a voltage contrast inspection. The test pattern may be designed with a shape of a contact chain.

The test pattern may include a pattern set including multiple grounded patterns 600 taking an "U" shape where both branches extend in one direction. The pattern set may include the grounded patterns 600 where branches extend in a first direction.

Each branch of the grounded patterns 600 may be a contact chain. The grounded patterns 600 may include multiple first segment sets 600S, multiple second segment sets 602 overlapping the multiple first segment sets 600S, and multiple first contact patterns 603 formed to serially connect the first segment sets 600S with the second segment sets 602 so that they alternate.

The monitoring pattern may include an interconnection layer to serially connect the grounded patterns 600. The interconnection layer may include interconnections 605 connecting adjacent grounded patterns with each other, second contact patterns 606 connected with the grounded patterns 600, and first and second probe pads 608a and 608b arranged at both ends of the interconnection layer, respectively.

Figure 9:
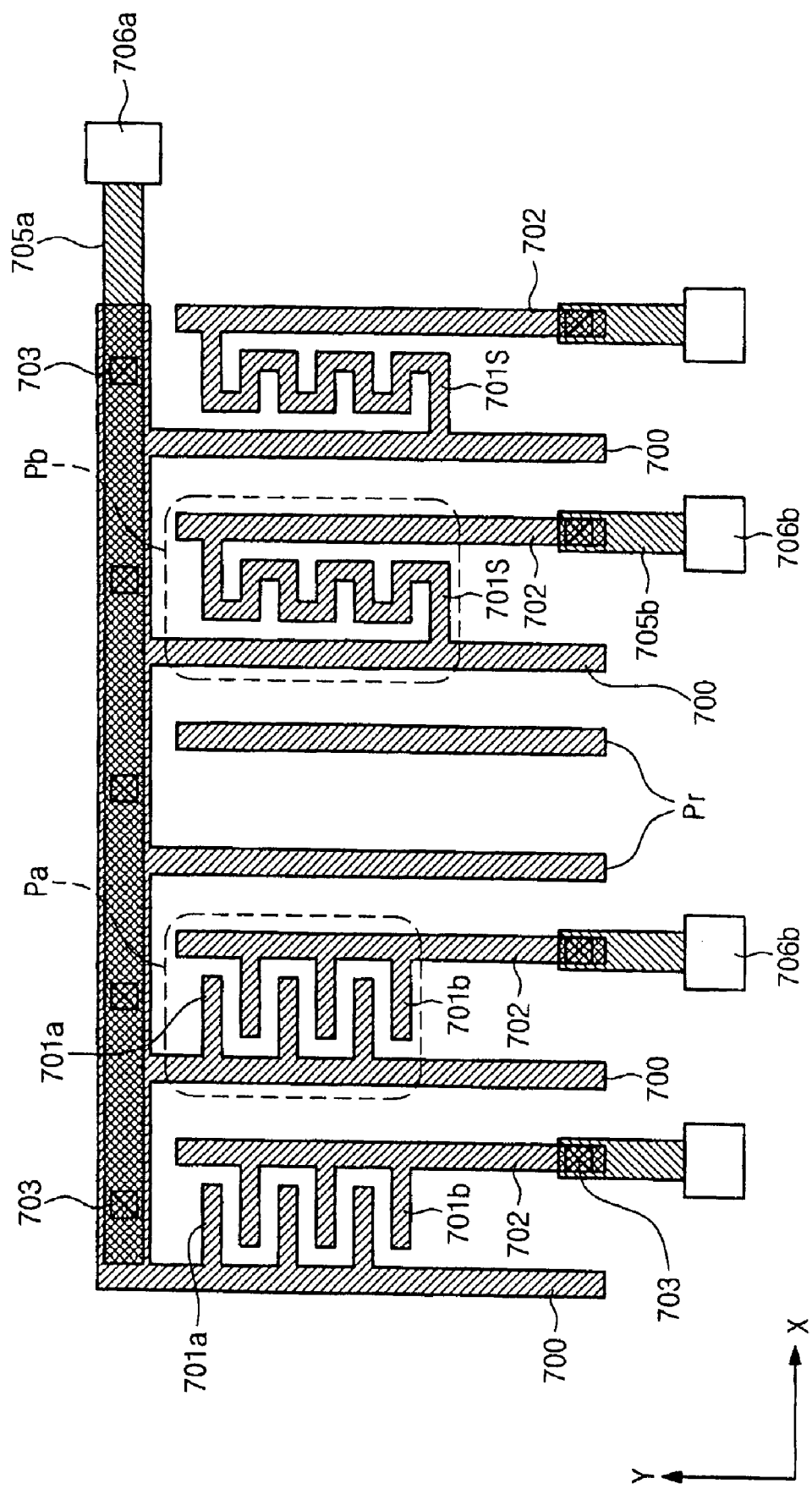

FIG. 9 illustrates a monitoring pattern according to a seventh embodiment of the present invention. The monitoring pattern of FIG. 9 may be employed to detect a defect occurrence status based on linewidths and intervals of structures forming a semiconductor circuit. In this regard, the monitoring pattern may include multiple sub-pattern sets, each including sub-patterns having intrinsic linewidths and spaced apart from each other at intrinsic intervals.

As illustrated in FIG. 9, the monitoring pattern may include a test pattern for a voltage contrast inspection. The test pattern may include grounded patterns 700, floating patterns 702 and contact patterns 703. The main configuration of the test pattern according to the seventh embodiment of the present invention may be similar to that of the test patterns according to the first and second embodiments of the present invention.

Sub-pattern sets (Pa, Pb) may be formed between a grounded pattern 700 and a floating pattern 702 that are adjacent to each other. The first sub-pattern set Pa may include multiple first sub-patterns 701a, extending in parallel from the grounded pattern 700, and multiple second sub-patterns 701b, extending from the floating pattern 702, to be arranged with the first sub-patterns 701a alternately. The second sub-pattern set Pb may include a sub-pattern 701S to connect the grounded pattern 700 with the floating pattern 702. The sub-pattern 701S may be designed to have multiple line feature portions spaced apart from each other at predetermined intervals. The floating pattern 702 connected with the second sub-pattern set Pb may have a ground potential that becomes a floating potential when the sub-pattern 701S of the second sub-pattern set Pb is short-circuited.

The test pattern may include only the first sub-pattern set Pa. Alternatively, the test pattern may include the second sub-pattern set Pb or both the first sub-pattern set Pa and the second sub-pattern set Pb. Moreover, the test pattern may include one sub-pattern set or multiple sub-pattern sets, each including multiple patterns having intrinsic linewidths and intrinsic intervals. Thus, defects based on linewidths and intervals may be analyzed, and the defects occurrence for the linewidths and the intervals may be understood.

During the voltage contrast inspection, an electron beam may be scanned over the test pattern to inspect voltage contrast images generated from the grounded patterns 700 and the floating patterns 702 using the secondary electron intensity. Thus, short-circuits or open-circuits of the sub-pattern set may be detected. The test pattern may include a reference pattern Pr including a line feature portion of the grounded patterns 700, where the sub-pattern set is not formed, and one of the floating patterns 702. The reference pattern Pr provides a reference value for analyzing a ground potential and a floating potential during the voltage contrast inspection.

The monitoring pattern may include an interconnection layer composed of a first interconnection 705a connected to the grounded patterns 700, second interconnections 705b connected to the floating patterns 702, a first probe pad 706a located at the first interconnection 705a, and second probe pads 706b located at the second interconnections 705b. The grounded patterns 700 may be connected in parallel to the first interconnection 705a, and the floating patterns 702 and the second interconnections 705b may be connected in one-to-one correspondence. Thus, the first interconnection 705a connected to one of the floating patterns 702 may be selected to detect an electrical continuity of a specific sub-pattern set.

During the voltage contrast inspection, the grounded patterns 700 and the floating patterns 702 of the test pattern may be scanned to detect a defective sub-pattern set, and the defective sub-pattern set may be scanned along the X-axis and the Y-axis to determine a defect position. As a result, a parameter of the sub-pattern set, i.e., the effect of linewidth and interval on defect occurrence, may be analyzed.

Figure 10:
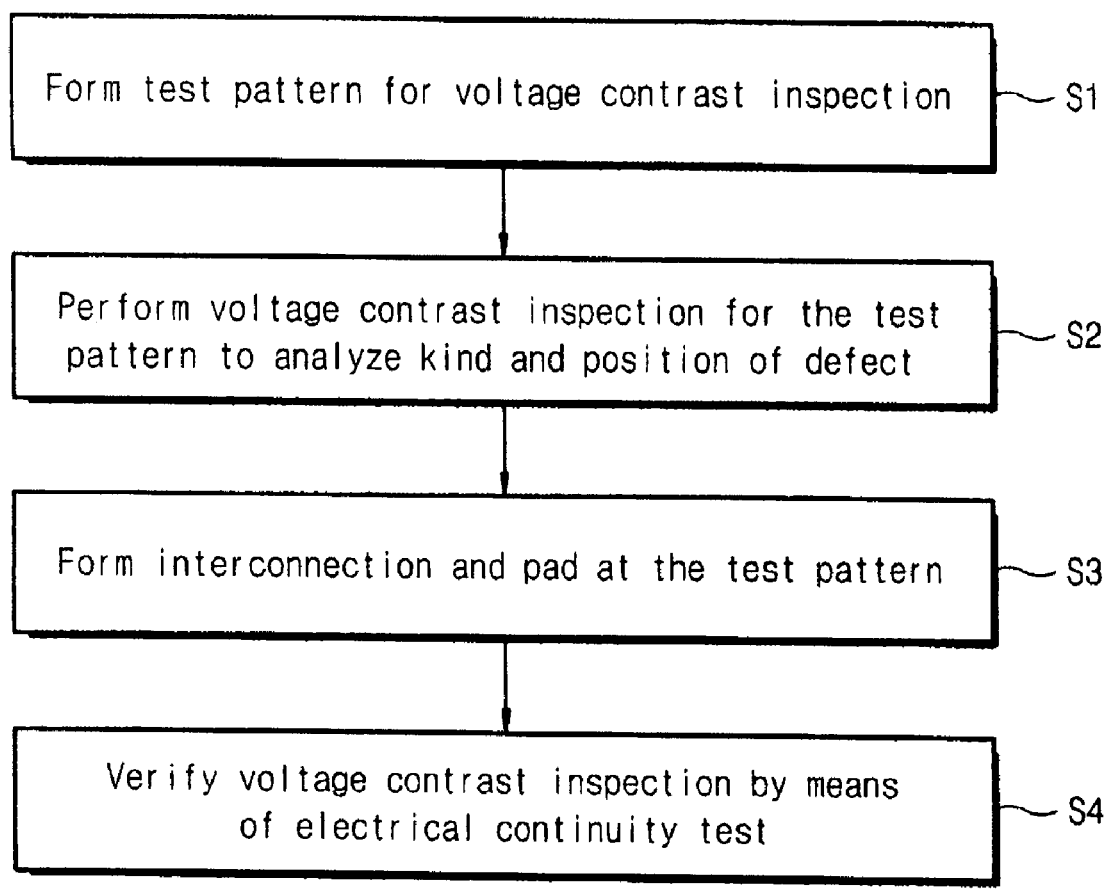
FIGS. 10 through 12 illustrate flowcharts of pattern monitoring methods using monitoring patterns according to embodiments of the present invention.

FIG. 10 illustrates a flowchart of a method for detecting a defect according to an embodiment of the present invention.

Referring to FIG. 10, the test pattern for a voltage contrast inspection may be formed at a predetermined region on a wafer to monitor a fabricating process and a circuit (S1). The test pattern may be one of the test patterns illustrated in FIG. 3 through FIG. 9.

An electron beam may be scanned over the test pattern to perform the voltage contrast inspection (S2). During the voltage contrast inspection (S2), short-circuits or open-circuits of the test pattern may be detected. The position of any defects in the test pattern may be determined by electron beam scanning along the X-axis and the Y-axis. As previously discussed, the voltage contrast of the grounded pattern and the voltage contrast of the floating pattern may be inspected in regards to a portion of the test pattern. When the displayed value is different from the expected value, the value may be used to detect the presence, kind and position of the defect.

If a defect is found in a layer where the test pattern is formed, a subsequent fabricating process may be carried out. In a step of forming an interconnection during the subsequent fabricating process, the interconnection and a pad may be formed at the test pattern (S3). In the process of forming the interconnection and the pad at the test pattern (S3), the monitoring pattern may be formed, as illustrated in FIG. 3 through FIG. 9.

Following the formation of the monitoring pattern, a subsequent fabricating process may be carried out to complete fabrication of a wafer-level semiconductor device. In a wafer where the process is completed, an electrical continuity of the monitoring pattern may be measured to verify the result of the voltage contrast inspection (S4). In an embodiment of the present invention, the electric continuity may be measured following formation of the monitoring pattern.

When the result of the measured electrical continuity matches that of the voltage contrast inspection, the result of the voltage contrast inspection may be considered to be verified. In this case, it may be possible to determine whether there are open-circuits or short-circuits of patterns in wafers where the same or similar devices are designed. That is, when determining whether there is a defect, only the electrical continuity may be tested without performing the voltage contrast inspection in order to reduce the cost of an inline system, inspection time, and the cost of the fabricating process.

Figure 11:
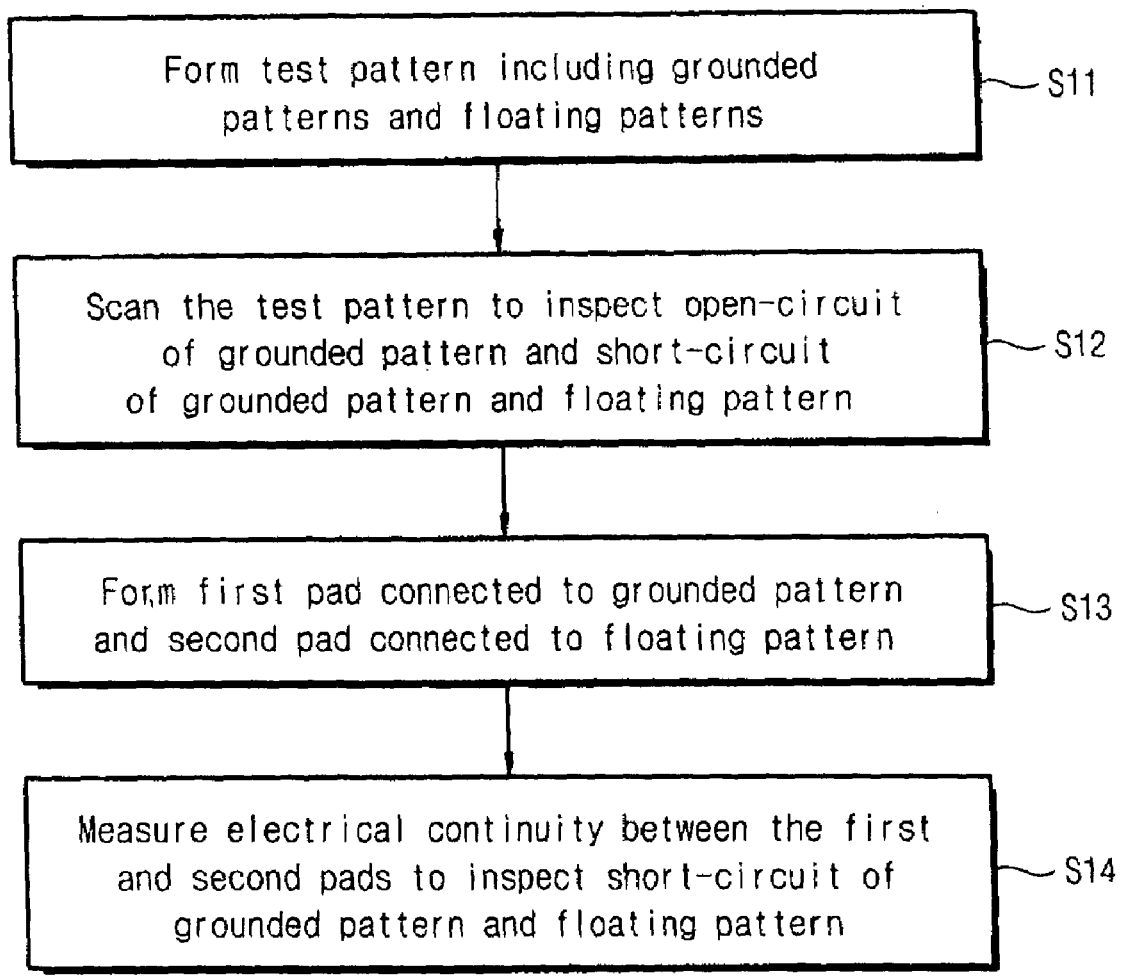

FIG. 11 illustrates a flowchart of a method for detecting a defect according to an embodiment of the present invention. A test pattern for a voltage contrast inspection may be formed at a predetermined region on a wafer to monitor a fabricating process and a circuit (S11). The test pattern may have the configuration illustrated in FIG. 3, FIG. 4 or FIG. 9. That is, the test pattern may include multiple grounded patterns and multiple floating patterns.

An electron beam may be scanned over the test pattern to perform a voltage contrast inspection (S12). During the voltage contrast inspection (S12), open-circuits of the grounded pattern or short-circuits of the grounded pattern and the floating pattern may be detected. The position of any defects in the test pattern may be determined by electron beam scanning along the X-axis and the Y-axis. As previously described, the voltage contrast of the grounded pattern and the voltage contrast of the floating pattern may be inspected in regards to a portion of the test pattern where the displayed value may be different from the expected value, so as to determine the presence, kind, and position of the defect.

If analyzing for defects in the layer where the test pattern is formed, a subsequent fabricating process may be carried out. When forming an interconnection during the subsequent fabricating process, a first pad may be connected with the grounded pattern, and a second pad may be connected with the floating pattern to form the monitoring pattern illustrated in, e.g., FIG. 3, FIG. 4 or FIG. 9.

Following the formation of the monitoring pattern, a subsequent fabricating process may be carried out to complete fabrication of a wafer-level semiconductor device. In a wafer where the processing has been completed, an electrical continuity of the monitoring pattern may be measured to verify the result of the voltage contrast inspection (S14). The electrical continuity of the first and second pads may be measured to detect short-circuit of the grounded pattern and the floating pattern. In some cases, the electric continuity may be measured following formation of the monitoring pattern.

Figure 12:
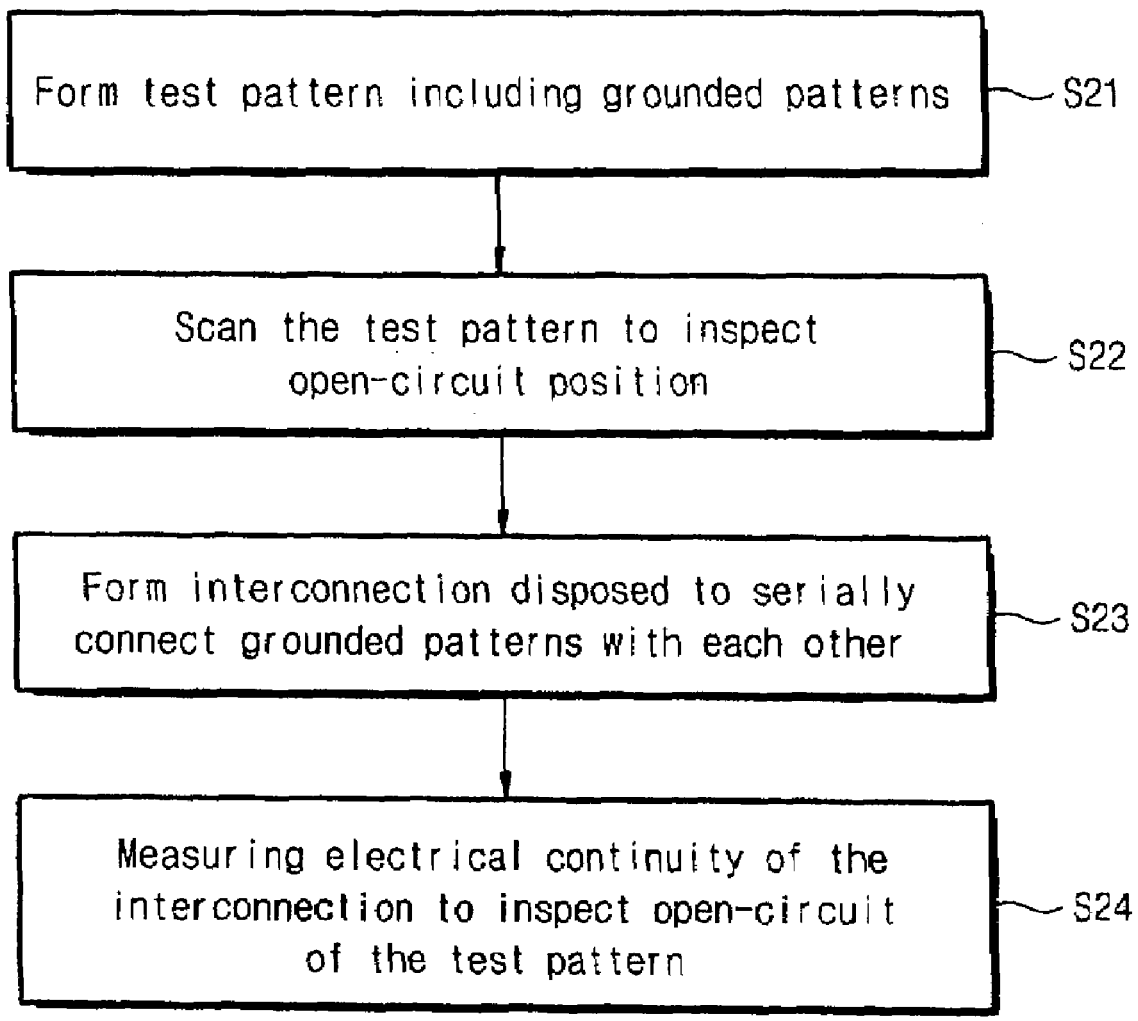

FIG. 12 illustrates a flowchart of a method for detecting a defect according to an embodiment of the present invention. A test pattern for a voltage contrast inspection may be formed at a predetermined region on a wafer to monitor a fabricating process and a circuit (S21). The test pattern may have the configuration illustrated in FIG. 5 through FIG. 9. That is, the test pattern may include multiple grounded patterns or may be designed to include the sub-pattern set coupled between the floating pattern and the grounded pattern.

An electron beam may be scanned over the test pattern to perform the voltage contrast inspection (S22). During the voltage contrast inspection (S22), the position of any defects in the test pattern may be determined by electron beam scanning along the X-axis and the Y-axis. As previously described, the voltage contrast of the grounded pattern may be inspected at a portion of the test pattern where the displayed value may be different from the expected value, thereby determining the presence, kind, and position of any defects.

When analyzing for a defect of a layer where the test pattern may be formed, a subsequent fabricating process may be carried out. During forming an interconnection during the subsequent fabricating process, the interconnection and pads may be formed at the test pattern (S23). During the formation of the interconnection and pads at the test pattern (S23), the interconnection may be formed to serially connect the grounded patterns with each other, and first and second pads may be formed at both ends of the interconnection, respectively.

Following the formation of the monitoring pattern, a subsequent fabricating process may be carried out to complete the fabrication of a wafer-level semiconductor device. In a wafer where the process is completed, an electrical continuity of the monitoring pattern may be measured to verify the result of the voltage contrast inspection (S24). The electrical continuity of the first and second pads may be measured to detect any open-circuits of the grounded pattern. In some cases, the electric continuity may be measured following formation of the monitoring pattern.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A monitoring pattern, comprising:
    a test pattern with a plurality of line shapes arranged in parallel and spaced apart at predetermined linewidths and intervals; and
    an interconnection layer connected to the test pattern,
    wherein the test pattern is adapted to be charged with a specific potential to be displayed as a voltage contrast image when scanned with an electron beam, and
    wherein the test pattern includes:
        a first pattern set including a plurality of grounded patterns,
        a second pattern set including a plurality of floating patterns, the grounded patterns and the floating patterns being alternately arranged, and
        at least one sub-pattern set between adjacent grounded and floating patterns, the sub-pattern set including a plurality of first sub-patterns extending in parallel from the grounded pattern and a plurality of second sub-patterns extending in parallel from the floating pattern.

2. The monitoring pattern as claimed in claim 1, wherein the plurality of grounded patterns extends in parallel at predetermined intervals.

3. The monitoring pattern as claimed in claim 1, wherein the interconnection layer includes at least one first interconnection connected to the grounded patterns and at least one second interconnection connected to the floating patterns, the first and second interconnections being adapted to measure electrical continuity between the grounded patterns and the floating patterns.

4. The monitoring pattern as claimed in claim 1, wherein the test pattern includes a plurality of the sub-pattern sets each comprising the first sub-pattern and the second sub-pattern which are arranged at a specific linewidth and a specific pitch.

5. The monitoring pattern as claimed in claim 1, wherein the interconnection layer includes at least one probe pad adapted to measure electrical continuity of the grounded patterns, the probe pad being arranged to connect the grounded patterns.

6. A monitoring pattern, comprising:
    a test pattern with a plurality of line shapes arranged in parallel and spaced apart at predetermined linewidths and intervals; and
    an interconnection layer connected to the test pattern,
    wherein the test pattern is adapted to be charged with a specific potential to be displayed as a voltage contrast image when scanned with an electron beam, and
    wherein the test pattern includes:
        a first pattern set including a plurality of grounded patterns,
        a second pattern set including a plurality of floating patterns, the grounded patterns and the floating patterns being alternately arranged, and
        at least one sub-pattern between adjacent grounded and floating patterns, the sub-pattern including a plurality of parallel feature portions to connect the grounded pattern with the floating pattern.

7. The monitoring pattern as claimed in claim 6, wherein the test pattern comprises a plurality of the sub-patterns, each having a feature portion at a specific linewidth and a specific pitch.

8. The monitoring pattern as claimed in claim 7, wherein the sub-pattern is not between at least one pair of adjacent grounded and floating patterns.

9. A method for detecting a defect in a semiconductor device, comprising:
    forming a test pattern on a semiconductor substrate, the test pattern having a plurality of line shapes arranged in parallel at predetermined linewidths and predetermined intervals;
    scanning an electron beam over the test pattern to perform a voltage contrast inspection;
    connecting an interconnections to the test pattern; and
    measuring electrical continuity of the test pattern through the interconnections to verify the voltage contrast inspection,
    wherein forming the test pattern includes:
        forming a first pattern set including a plurality of grounded patterns,
        forming a second pattern set including a plurality of floating patterns, wherein the grounded patterns and the floating patterns are alternately arranged, and
        forming at least one sub-pattern set between adjacent grounded and floating patterns, the sub-pattern set including a plurality of first sub-patterns extending in parallel from the grounded pattern and a plurality of second sub-patterns extending in parallel from the floating pattern arranged alternately with the first sub-patterns.

10. The method as claimed in claim 9, wherein when a voltage contrast value different from an expected value while the electron beam is scanned over the test pattern is measured, a defect is detected.

11. The method as claimed in claim 9, wherein a plurality of the sub-pattern sets are formed at the test pattern, wherein a first pattern and a second pattern of the respective sub-pattern sets are formed at a specific linewidth and a specific pitch, and a defect caused by the linewidth and the pitch is detected.

12. The method as claimed in claim 9, wherein:
    when forming the test pattern, the test pattern includes a plurality of grounded patterns extending in parallel at predetermined intervals; and
    when connecting the interconnections, at least one interconnection connects the grounded patterns with each other.

* * * * *